(12) United States Patent
Maeda

(10) Patent No.: US 7,154,336 B2
(45) Date of Patent: Dec. 26, 2006

(54) HIGH-FREQUENCY POWER AMPLIFIER

(75) Inventor: Masahiro Maeda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/961,118

(22) Filed: Oct. 12, 2004

(65) Prior Publication Data

US 2005/0077964 A1   Apr. 14, 2005

(30) Foreign Application Priority Data

Oct. 14, 2003  (JP)  ............................. 2003-353470
Aug. 26, 2004  (JP)  ............................. 2004-247082

(51) Int. Cl.
*H03G 3/10* (2006.01)

(52) U.S. Cl. .................. 330/285; 330/289; 330/302

(58) Field of Classification Search ................ 330/285, 330/289, 302
See application file for complete search history.

(56) References Cited

U.S. PATENT DOCUMENTS

| | | | | |
|---|---|---|---|---|
| 4,924,194 | A | * | 5/1990 | Opas et al. .................. 330/289 |
| 5,392,463 | A | * | 2/1995 | Yamada ....................... 455/93 |
| 5,629,648 | A | | 5/1997 | Pratt |
| 6,005,441 | A | | 12/1999 | Kawahara |
| 6,233,440 | B1 | * | 5/2001 | Taylor ...................... 455/127.2 |
| 6,326,849 | B1 | | 12/2001 | Wang et al. |
| 6,344,775 | B1 | | 2/2002 | Morizuka et al. |
| 6,549,076 | B1 | | 4/2003 | Kuriyama |
| 6,891,438 | B1 | * | 5/2005 | Arai et al. .................. 330/296 |
| 6,956,437 | B1 | * | 10/2005 | Lopez et al. ................ 330/296 |
| 2003/0201827 | A1 | | 10/2003 | Ohnishi et al. |

FOREIGN PATENT DOCUMENTS

| | | |
|---|---|---|
| JP | 9-83268 A | 3/1997 |
| JP | 11-214932 A | 8/1998 |
| JP | 11-195932 | 7/1999 |
| JP | 2000-208940 | 7/2000 |
| JP | 2000-332124 | 11/2000 |
| JP | 2002-100938 A | 4/2002 |
| JP | 2002-171143 | 6/2002 |
| JP | 2002-290174 A | 10/2002 |
| JP | 2002-314347 A | 10/2002 |

OTHER PUBLICATIONS

Blount, Paul., et al. "A 3.5GHz Fully Integrated Power Amplifier Module." Annual IEEE Gallium Arsenide Integrated Circuit Symposium, Technical Digest 2001, IEEE GaAs Digest, XP001046970, pp. 111-114.
Noh, Y.S., et al. "Linearized High Efficient HBT Power Amplifier Module for L-Band Application." Annual IEEE Gallium Arsenide Integrated Circuit Symposium, Technical Digest 2001, IEEE GaAs Digest, XP001046988, pp. 197-200.

* cited by examiner

Primary Examiner—Patricia Nguyen
(74) Attorney, Agent, or Firm—McDermott Will & Emery LLP

(57) ABSTRACT

The present invention provides a compact and low-cost high-frequency power amplifier including GaAs heterojunction bipolar transistors (HBTs) but having a low level of noise in the transmission band. In the high-frequency power amplifier of the present invention, a chip capacitor 21 is connected at one end to an upstream stage bias circuit 107 via a bonding wire B1, and grounded at the other end. Also, a chip inductor 22 is connected to a base electrode of a high-frequency signal amplification HBT 101 via a bonding wire B2. In the high-frequency power amplifier of the present invention, the chip capacitor 21 causes noise generated within the upstream stage bias circuit 107 to flow to the ground, thereby reducing noise in the reception band. Also, the chip inductor 22 reduces a power loss of a high-frequency signal which is caused because the high-frequency signal flows to the ground.

7 Claims, 10 Drawing Sheets

HIGH-FREQUENCY POWER AMPLIFIER

BACKGROUND OF THE INVENTION

1. Field of the Invention

The present invention relates to a high-frequency power amplifier, and more particularly to a high-frequency power amplifier for use in mobile communication equipment including mobile telephones.

2. Description of the Background Art

In recent years, mobile telephones have become indispensable to our lives not only as calling tools but also as communication tools for exchanging E-mails, content, etc. Currently, the most prevalent mobile telephone communication systems used in the world are the second generation communication systems. In Japan, the personal digital cellular (PDC) system is widely used; in North America, the code division multiple access (CDMA) system is widely used; in Europe, the global system for mobile (GSM) system is widely used.

It is expected that in the near future, the market for mobile telephones will experience a transition to the third communication systems, such as the wideband code division multiple access (W-CDMA) system and the universal mobile telecommunications (UMT) system, enabling more reliable and faster communication of large-volume content data such as video images. In order to enable adaptation to such a change of the market, compact and multifunctional mobile telephones compatible with the third-generation communication systems and base station equipment therefor are currently under development.

Generally, in the market for mobile telephones, there have been needs for more compact and lighter mobile telephones having longer talk and standby times. In order to realize such mobile telephones, it is necessary to reduce the size of batteries used for the mobile telephones and to achieve higher efficiency (higher power savings) of power-consuming transmission power amplifiers.

The transmission power amplifiers for use in mobile telephones are called power amplifier (PA) modules. Conventionally, the PA modules include GaAs transistors having satisfactory high-frequency characteristics and a satisfactory conversion efficiency in converting direct current into a high-frequency signal. The GaAs transistors are generally classified into field-effect transistors (hereinafter, abbreviated as "FETs"), and heterojunction bipolar transistors (hereinafter, abbreviated as "HBTs").

As an exemplary PA module for use in the mobile telephones, Japanese Laid-Open Patent Publication No. 11-195932 discloses a PA module which includes GaAs FETs. However, the PA module including the GaAs FETs requires a power supply for applying negative bias voltage to a gate electrode, resulting in an increase in number of components of the PA module, and making it difficult to reduce the size, weight, and cost of the mobile telephones. Thus, recent years have seen the GaAs FETs replaced with the GaAs HBTs, as transistors for use in the PA modules, which do not require any negative power supply and can operate on a single positive power supply.

Hereinbelow, a conventional PA module using GaAs HBTs for two-stage power amplification is described with reference to the drawings. FIG. 9 is a circuit diagram of the conventional PA module. The PA module shown in FIG. 9 includes high-frequency signal amplification HBTs 101 and 102, an input terminal Pin, an output terminal Pout, earth terminals, collector power supply terminals Vcc1 and Vcc2, choke coils 108 and 109, an upstream stage bias circuit 107, a downstream stage bias circuit 110, an input matching circuit 105, an interstage matching circuit 140, and an output matching circuit 106.

A high-frequency signal is inputted from the input terminal Pin through the input matching circuit 105 to the high-frequency signal amplification HBT 101. The input matching circuit 105 performs impedance matching for the high-frequency signal inputted from the input terminal Pin, thereby preventing the high-frequency signal from being reflected by the high-frequency signal amplification HBT 101. The high-frequency signal is inputted to the high-frequency signal amplification HBT 101, and amplified therein. Thereafter, the amplified signal is transferred through the interstage matching circuit 140 to the high-frequency signal amplification HBT 102.

The interstage matching circuit 140 performs impedance matching on the high-frequency signal amplified by the high-frequency signal amplification HBT 101, thereby preventing the high-frequency signal from being reflected by the high-frequency signal amplification HBT 102. The high-frequency signal is inputted to the high-frequency signal amplification HBT 102 and amplified therein. Thereafter, the amplified signal is outputted from the output terminal Pout via the output matching circuit 106. The output matching circuit 106 performs impedance matching on the high-frequency signal amplified by the high-frequency signal amplification HBT 102, thereby preventing the high-frequency signal from being reflected from outside the PA module.

The high-frequency signal amplification HBT 101 has a collector electrode connected to the collector power supply terminal Vcc1 via the choke coil 108. The choke coil 108 prevents the high-frequency signal outputted by the high-frequency signal amplification HBT 101 from leaking out from the collector power supply terminal Vcc1. Also, the high-frequency signal amplification HBT 101 has abase electrode connected to the upstream stage bias circuit 107. The upstream stage bias circuit 107 supplies bias current to the base electrode of the high-frequency signal amplification HBT 101.

Similarly, the high-frequency signal amplification HBT 102 has a collector electrode connected to the collector power supply terminal Vcc2 via the choke coil 109. Also, the high-frequency signal amplification HBT 102 has a base electrode connected to the downstream stage bias circuit 110. The downstream stage bias circuit 110 supplies bias voltage to the base electrode of the high-frequency signal amplification HBT 102.

The upstream stage bias circuit 107 and the downstream stage bias circuit 110 have a function of temperature-compensating the high-frequency signal amplification HBTs 101 and 102, respectively. These bias circuits are designed such that constant idling current flows to the high-frequency signal amplification HBTs 101 and 102 regardless of ambient temperature.

Hereinafter, the structure of the upstream stage bias circuit 107 is described with reference to FIG. 10. FIG. 10 is a circuit diagram of a high-frequency power amplifier used as an upstream stage amplification section of the conventional PA module. The high-frequency power amplifier shown in FIG. 10 includes the high-frequency signal amplification HBT 101, the input terminal Pin, an earth terminal, the collector power supply terminal Vcc1, the choke coil 108, the upstream stage bias circuit 107, the input matching circuit 105, the interstage matching circuit 140, and a resistor 115.

The upstream stage bias circuit 107 includes a reference voltage terminal Vref, resistors 111 and 114, earth terminals, a temperature compensation circuit 112, and a direct current supply HBT 113. The resistor 111 and the temperature compensation circuit 112 are connected between the reference voltage terminal Vref and an earth terminal. Node A shown in FIG. 10 is a point at which the resistor 111 and the temperature compensation circuit 112 are connected to each other. Potential at the node A is controlled by changing a resistance value of the resistor 111.

The direct current supply HBT 113 has a base electrode connected to the node A. The direct current supply HBT 113 has an emitter electrode grounded via the resistor 114. The emitter electrode of the direct current supply HBT 113 is also connected to the base electrode of the high-frequency signal amplification HBT 101 via the resistor 115. With the above structure, the direct current supply HBT 113 supplies bias current to the high-frequency signal amplification HBT 101.

The temperature compensation circuit 112 includes temperature compensation HBTs 112a and 112b. The temperature compensation HBT 112a has base and collector electrodes connected to the node A. Also, the temperature compensation HBT 112a has an emitter electrode connected to base and collector electrodes of the temperature compensation HBT 112b. The temperature compensation HBT 112b has an emitter electrode which is grounded. The temperature compensation HBTs 112a and 112b are transistors having the same characteristics as those of the direct current supply HBT 113 and the high-frequency signal amplification HBT 101. With the above structure, the temperature compensation circuit 112 temperature-compensates the high-frequency signal amplification HBT 101.

The reception efficiency of the mobile telephone is defined by the receiver sensitivity. If noise in a reception band (Rx noise) outputted from the PA module is greater than a predetermined value, the receiver sensitivity of the mobile telephone is reduced, adversely affecting the reception efficiency. A tolerable Rx noise level is generally less than or equal to −137 dBm/Hz.

In mobile telephones in which conventional GaAs FETs are used in the PA modules, the Rx noise level is less than or equal to −140 dBm/Hz, causing no adverse effect on the use of the mobile telephones. However, in recent years, the GaAs FETs used in the PA modules have been replaced by the GaAs HBTs, attracting attention on adverse effects of the RX noise on the receiver sensitivity of mobile telephones.

The conventional PA module shown in FIG. 9 was actually produced with GaAs HBTs designed to have a maximum oscillation frequency of 25 GHz, and the Rx noise of the PA module was measured. In the case where the PA module was set so as to have output power of 28 dBm and gain of 28 dB in a transmission band from 824 MHz to 849 MHz, the Rx noise level in a reception band from 884 MHz to 909 MHz was −132 dBm/Hz. As a result, it was found that in the conventional PA module using the GaAs HBTs, the Rx noise is at such a level as to adversely affect the receiver sensitivity of the mobile telephones.

Typically, the Rx noise level of a PA module can be calculated based on a thermal noise level (=−174 dBm/Hz), gain (Grx) in the reception band of the PA module, and a noise factor (NF) of the PA module. In a conventional PA module using the GaAs FETs, if Grx=28 dB and NF=4 dB, the Rx noise level is −142 dBm/Hz. This result is approximately consistent with measured values.

On the other hand, in a conventional PA module using the GaAs HBTs, if Grx=28 dB and NF=6 dB, the Rx noise level is −140 dBm/Hz. Accordingly, it is understood that the above measured value (Rx=−132 dBm/Hz) considerably exceeds the theoretical value.

Upon analysis of differences between the PA module using the GaAs HBTs and the PA module using the GaAs FETs based on the experimental result of the Rx noise level of the PA module using the GaAs HBTs, and the result of the theoretical calculation, it can be said that the source of the Rx noise in the PA module using the GaAs HBTs is the bias circuit. Specifically, it can be said that the Rx noise of the PA module using the GaAs HBTs occurs because 60 MHz noise corresponding to a difference in frequency between transmission and reception bands (hereinafter, referred to as a "difference frequency signal") is generated in the upstream stage bias circuit 107, and the difference frequency signal and a transmission wave signal are mixed together in the PA module.

Also, recent years have seen active reduction in size of duplexers for realizing more compact mobile telephones. As compared to before, the duplexers are becoming unsatisfactory in terms of attenuation levels in the reception band. In particular for the PA module using the GaAs HBTs, which generally has a higher Rx level than the PA module using the GaAs FETs, the above problem related to the Rx noise requires urgent resolution.

SUMMARY OF THE INVENTION

Therefore, an object of the present invention is to provide a compact and low-cost high-frequency power amplifier including GaAs HBTs but having a low Rx level.

A high-frequency power amplifier of the present invention includes: a high-frequency signal amplification transistor for amplifying the high-frequency signal; a bias circuit for supplying current to a base electrode of the high-frequency signal amplification transistor; an inductor connected between the high-frequency signal amplification transistor and the bias circuit; and a capacitor connected at one end between the bias circuit and the inductor and grounded at another end.

It is preferred that in the high-frequency power amplifier of the present invention, a capacitance value of the capacitor is in the range from 20 pF to 10000 pF.

Also, it is preferred that in the high-frequency power amplifier of the present invention, an inductance of the inductor is equal to or more than 5 nH.

It is preferred that in the high-frequency power amplifier of the present invention, the bias circuit includes: a current supply transistor for supplying current to the high-frequency signal amplification transistor; and a temperature compensation circuit for temperature-compensating the high-frequency signal amplification transistor.

Also, it is preferred that the high-frequency power amplifier of the present invention further includes a resistor connected between the high-frequency signal amplification transistor and the inductor.

Also, it is preferred that in the high-frequency power amplifier of the present invention, the high-frequency signal amplification transistor and the bias circuit are formed on a semiconductor substrate.

Also, in the high-frequency power amplifier of the present invention, the inductor and the capacitor each may be composed of a chip device.

Also, it is preferred that in the high-frequency power amplifier of the present invention, the current supply transistor has a high frequency gain lower than that of the high-frequency signal amplification transistor.

Also, it is preferred that in the high-frequency power amplifier of the present invention, the inductor is a spiral inductor formed on the semiconductor substrate.

Also, it is preferred that in the high-frequency power amplifier of the present invention, a resistance between the high-frequency signal amplification transistor and the bias circuit is provided by the spiral inductor.

Also, it is preferred that in the high-frequency power amplifier of the present invention, the spiral inductor has a resistance of 5Ω or more.

Also, it is preferred that the high-frequency power amplifier of the present invention further includes a resistor connected between the high-frequency signal amplification transistor and the spiral inductor.

Alternatively, the high-frequency power amplifier of the present invention may preferably further include a resistor connected between the bias circuit and the capacitor.

Also, in the high-frequency power amplifier of the present invention, the capacitor may be formed using a laminated structure of the semiconductor substrate.

Alternatively, in the high-frequency power amplifier of the present invention, the capacitor may be formed on the semiconductor substrate using a high-k dielectric material.

The high-k dielectric material may be a strontium titanium oxide.

Also, it is preferred that a high-frequency power amplifier of the present invention includes: a first transistor for amplifying the high-frequency signal; and a bias circuit for supplying bias current to a base electrode of the first transistor, and the bias circuit includes: a second transistor having a characteristic different from that of the first transistor; and a temperature compensation circuit for temperature-compensating the first transistor.

Also, it is preferred that in the high-frequency power amplifier of the present invention, the second transistor has a high frequency gain lower than that of the first transistor.

Also, it is preferred that a high-frequency power amplifier of the present invention includes: a transistor for amplifying the high-frequency signal; a bias circuit for supplying bias current to a base electrode of the transistor; a conductive line connected between the transistor and the bias circuit; and a capacitor connected at one end between the bias circuit and the conductive line and grounded at another end, and the conductive line provides, as distributed constants, an inductance and a resistance which are required between the transistor and the bias circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 10:
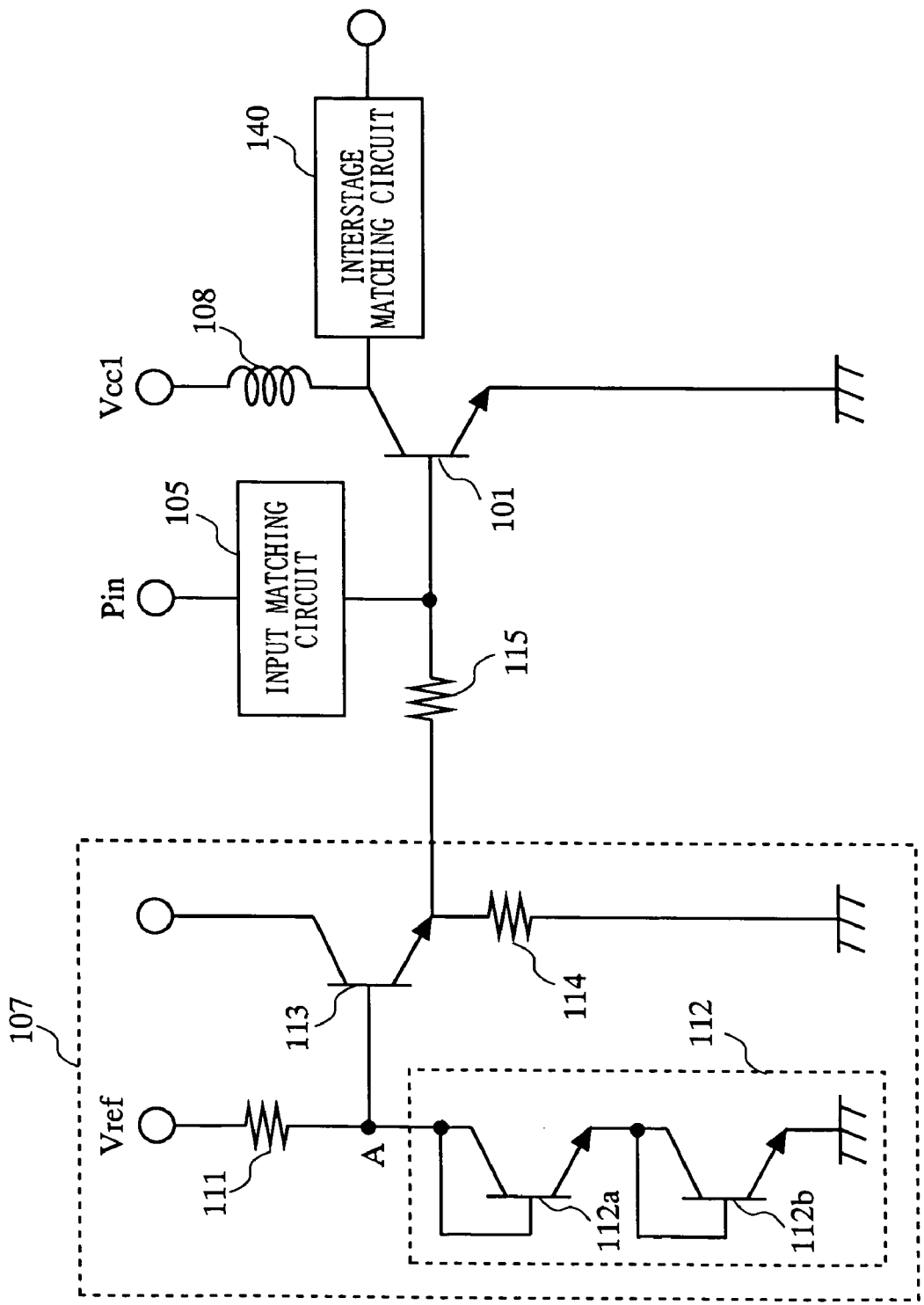
FIG. 10 is a circuit diagram of a conventional high-frequency power amplifier.

Hereinafter, embodiments of a high-frequency power amplifier of the present invention will be described with reference to the drawings. Note that for all of the embodiments, only an upstream stage amplification section of a PA module is shown for the sake of simplification. For each embodiment, an experiment for verifying an effect of a high-frequency power amplifier according to the embodiment was carried out using a PA module for two-stage power amplification with a downstream stage amplification section connected to the high-frequency power amplifier according to the embodiment. Note that the downstream stage amplification section of the PA module is the same as the high-frequency power amplifier shown in FIG. 10.

Figure 1:
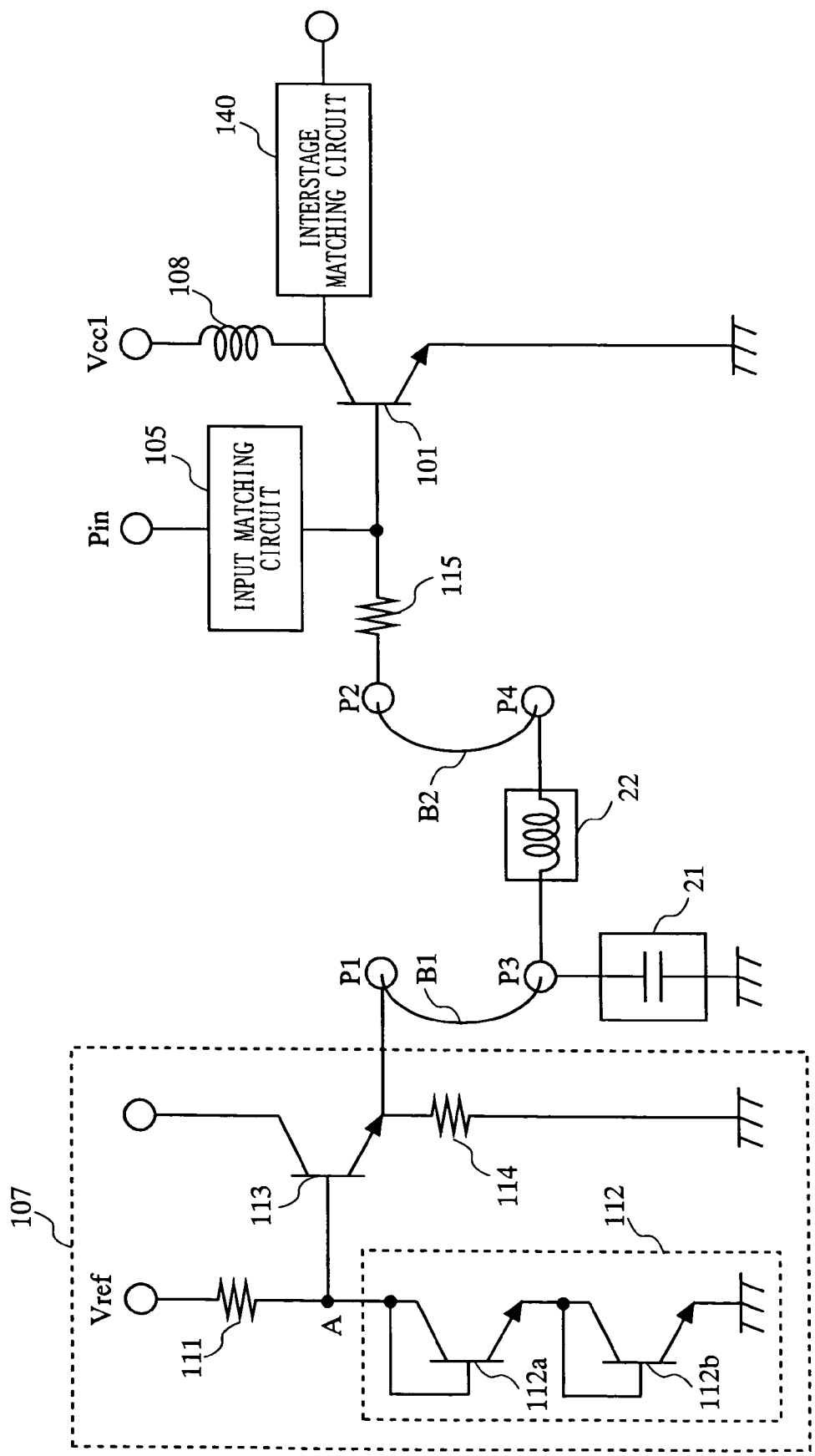
FIG. 1 is a circuit diagram of a high-frequency power amplifier according to a first embodiment of the present invention.

FIG. 1 is a circuit diagram of a high-frequency power amplifier according to a first embodiment of the present invention. The high-frequency power amplifier according to the present embodiment includes a high-frequency signal amplification HBT 101, an input terminal Pin, earth terminals, a collector power supply terminal Vcc1, a choke coil 108, an upstream stage bias circuit 107, an input matching circuit 105, an interstage matching circuit 140, a chip capacitor 21, a chip inductor 22, bonding wires B1 and B2, pads P1 through P4, and a resistor 115. The chip capacitor 21 and the chip inductor 22 included in the high-frequency power amplifier shown in FIG. 1 reduce Rx noise that is generated within the high-frequency power amplifier.

As shown in FIG. 1, the upstream stage bias circuit 107 includes a reference voltage terminal Vref, resistors 111 and 114, earth terminals, a temperature compensation circuit 112, and a direct current supply HBT 113. The resistor 111 and the temperature compensation circuit 112 are connected between the reference voltage terminal Vref and an earth terminal. Node A shown in FIG. 1 is a point at which the resistor 111 and the temperature compensation circuit 112 are connected to each other. Potential at the node A is controlled by changing a resistance value of the resistor 111. The direct current supply HBT 113 has a base electrode connected to the node A, and an emitter electrode grounded via the resistor 114.

The temperature compensation circuit 112 includes temperature compensation HBTs 112a and 112b. The temperature compensation HBT 112a has base and collector electrodes connected to the node A. Also, the temperature compensation HBT 112a has an emitter electrode connected to base and collector electrodes of the temperature compensation HBT 112b. The temperature compensation HBT 112b has an emitter electrode which is grounded. The temperature compensation HBTs 112a and 112b are transistors having the same characteristics as those of the direct current supply HBT 113 and the high-frequency signal amplification HBT 101. With the above structure, the temperature compensation circuit 112 temperature-compensates the high-frequency signal amplification HBT 101.

The direct current supply HBT 113 has an emitter electrode connected to the pad P1. The pads P1 and P3 are connected together by the bonding wire B1. The chip capacitor 21 is connected at one end to the pad P3 and grounded at the other end. The chip inductor 22 is connected between the pads P3 and P4. The pads P4 and P2 are connected together by the bonding wire B2. The resistor 115 is connected at one end to the pad P2 and at the other end to a base electrode of the high-frequency signal amplification HBT 101. With the above structure, the direct current supply HBT 113 supplies bias current to the high-frequency signal amplification HBT 101.

The chip capacitor 21 is provided in order to cause a difference frequency signal generated within the upstream stage bias circuit 107 to flow to the ground. This reduces the level of the difference frequency signal that is inputted to the high-frequency signal amplification HBT 101.

The chip inductor 22 is provided in order to prevent a high-frequency signal outputted by the input matching circuit 105 from flowing through the chip capacitor 21 to the ground. This reduces a power loss of the high-frequency signal which is caused because the high-frequency signal flows to the ground.

Figure 2:
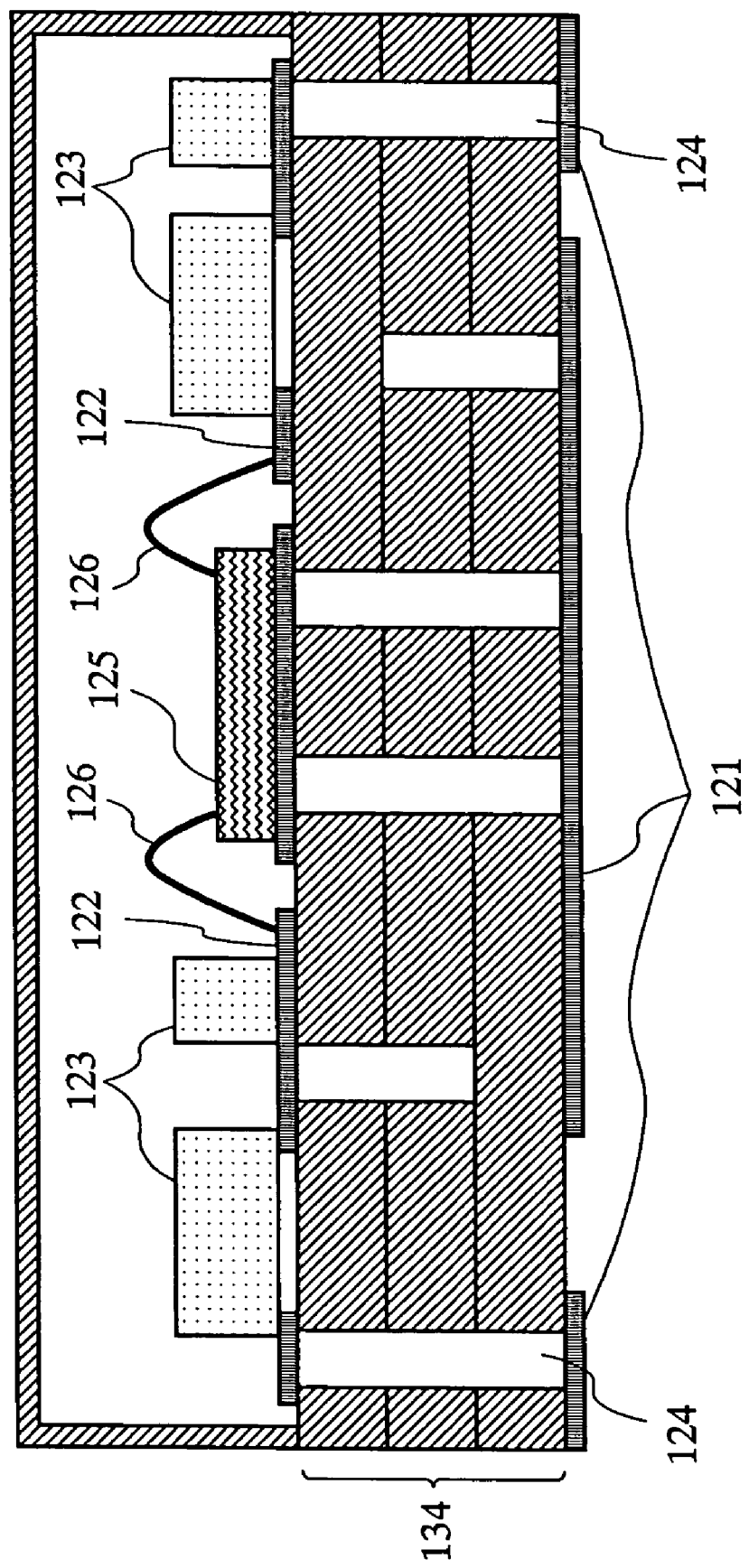
FIG. 2 is a view showing an exemplary structure of a PA module obtained by forming the high-frequency power amplifier according to the first embodiment of the present invention on a semiconductor substrate.

FIG. 2 is a view showing an exemplary structure of a PA module obtained by forming the high-frequency power amplifier shown in FIG. 1 on a semiconductor substrate. The PA module shown in FIG. 2 includes a module substrate 134, a GaAs HBT chip 125, passive chip devices 123, bonding wires 126, a bottom-side terminal 121, and metal conductors 122. The module substrate 134 is composed of a three-layer ceramic substrate. The ceramic substrate has provided therein through holes 124 for connecting the bottom-side terminal 121 to the metal conductors 122, etc.

The input matching circuit 105, the interstage matching circuit 140, etc., shown in FIG. 1 are composed of the metal conductors 122 and the passive chip devices 123 such as chip capacitors, chip resistors, and chip inductors. Various terminals, including a high-frequency signal input terminal, a high-frequency signal output terminal, earth terminals, a power supply terminal, a control terminal, etc., are provided on the bottom-side terminal 121 which is the lowest layer of the module substrate 134.

In order to reduce the size of the PA module, metal lines (not shown), e.g., λ/4 impedance transformers, are formed in the inner layer of the module substrate 134. Part of the metal conductors 122 formed on the three-layer ceramic substrate is connected to the bottom-side terminal 121 via the through holes 124. The GaAs HBT chip 125 is mounted on a ground electrode formed on top of the top layer of the module substrate 134. The GaAs HBT chip 125 and the metal conductors 122 are connected together by the bonding wires 126.

Although not shown in FIG. 2, the GaAs HBT chip 125 has formed thereon the pads P1 and P2, the upstream stage bias circuit 107, and the high-frequency signal amplification HBT 101, which are shown in FIG. 1. The pads P3 and P4 are composed of the metal conductors 122. The chip inductor 22 and the chip capacitor 21, which are shown in FIG. 1, are each composed of a passive chip device 123. The bonding wires B1 and B2 are provided as the bonding wires 126.

Experiments concerning capacitance values of the chip capacitor 21 were carried out, and it was found that capacitors having a capacitance value in the range from 20 pF to 10000 pF are effective at reducing the Rx noise if the frequency of the difference frequency signal is substantially in the range from 40 MHz to 200 MHz.

Also, experiments concerning inductances of the chip inductor 22 were carried out, and it was found that inductors having an inductance of 5 nH or more are effective at preventing the loss of the high-frequency signal if the frequency of the high-frequency signal is substantially in the range from 800 MHz to 2 GHz.

Figure 9:
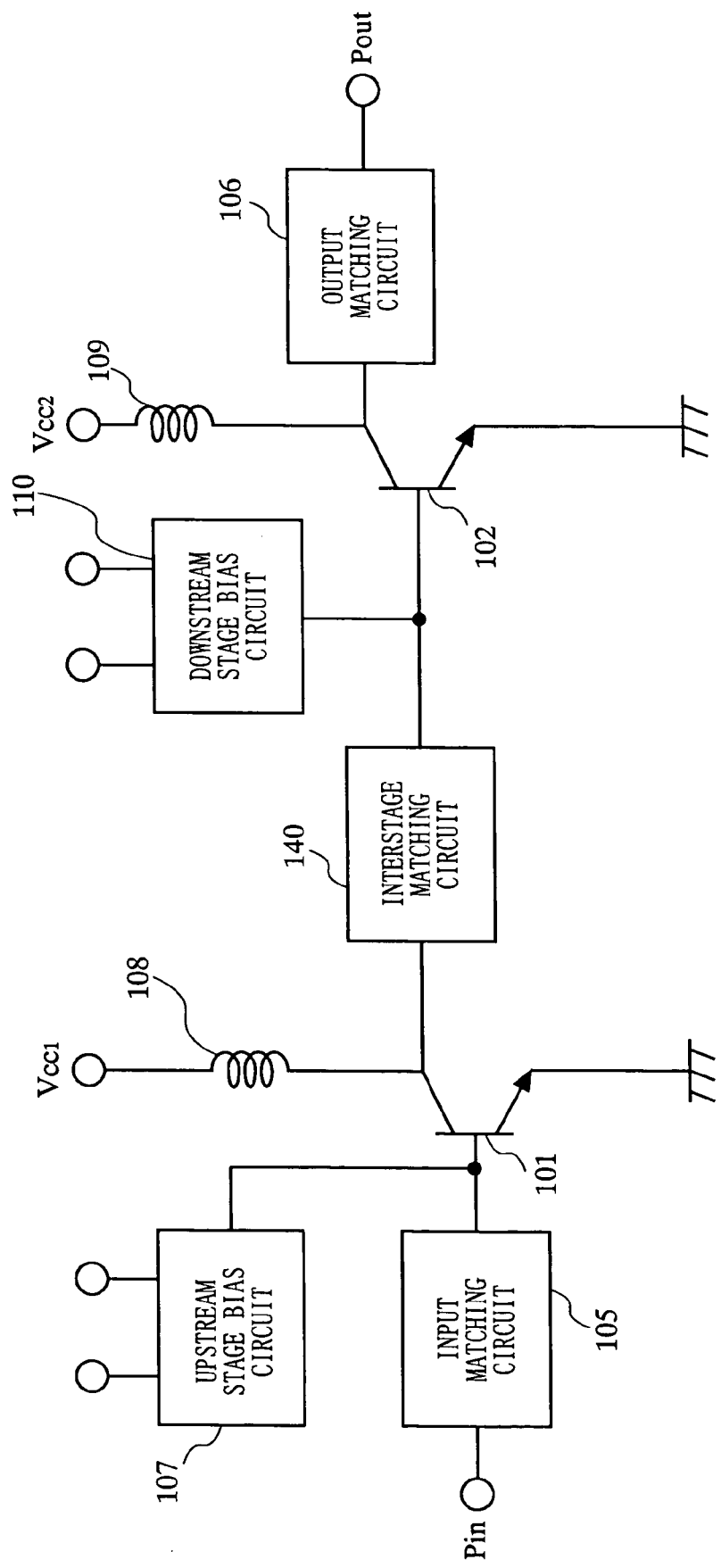
FIG. 9 is a circuit diagram of a conventional PA module which carries out two-stage power amplification.

An experiment was carried out with a PA module having its downstream stage amplification section connected to the high-frequency power amplifier according to the present embodiment. As a result, it was found out that the level of Rx noise in a reception band from 884 MHz to 909 MHz is −137 dBm/Hz in the case where a chip capacitor 21 having a capacitance value of 1000 pF and a chip inductor 22 having an inductance of 10 nH are used and the gain of the PA module is set so as to be 28 dB in a transmission band from 824 MHz to 849 MHz. Accordingly, the level of the Rx noise was reduced by 5 dBm/Hz from that of the conventional PA module shown in FIG. 9.

As such, in the high-frequency power amplifier according to the present embodiment, where the chip capacitor 21 grounded at one end is provided between the high-frequency signal amplification HBT 101 and the upstream stage bias circuit 107, the difference frequency signal generated within the upstream stage bias circuit 107 is caused to flow to the ground, thereby reducing the level of the difference frequency signal that is inputted to the high-frequency signal amplification HBT 101. Also, in the high-frequency power amplifier according to the present embodiment, where the chip inductor 22 is provided between the chip capacitor 21 and the high-frequency signal amplification HBT 101, the loss of the high-frequency signal, which is caused because the high-frequency signal flows to the ground, is reduced, whereby it is possible to reduce the level of the Rx noise to such an extent as not to affect the receiver sensitivity of mobile telephones.

Figure 3:
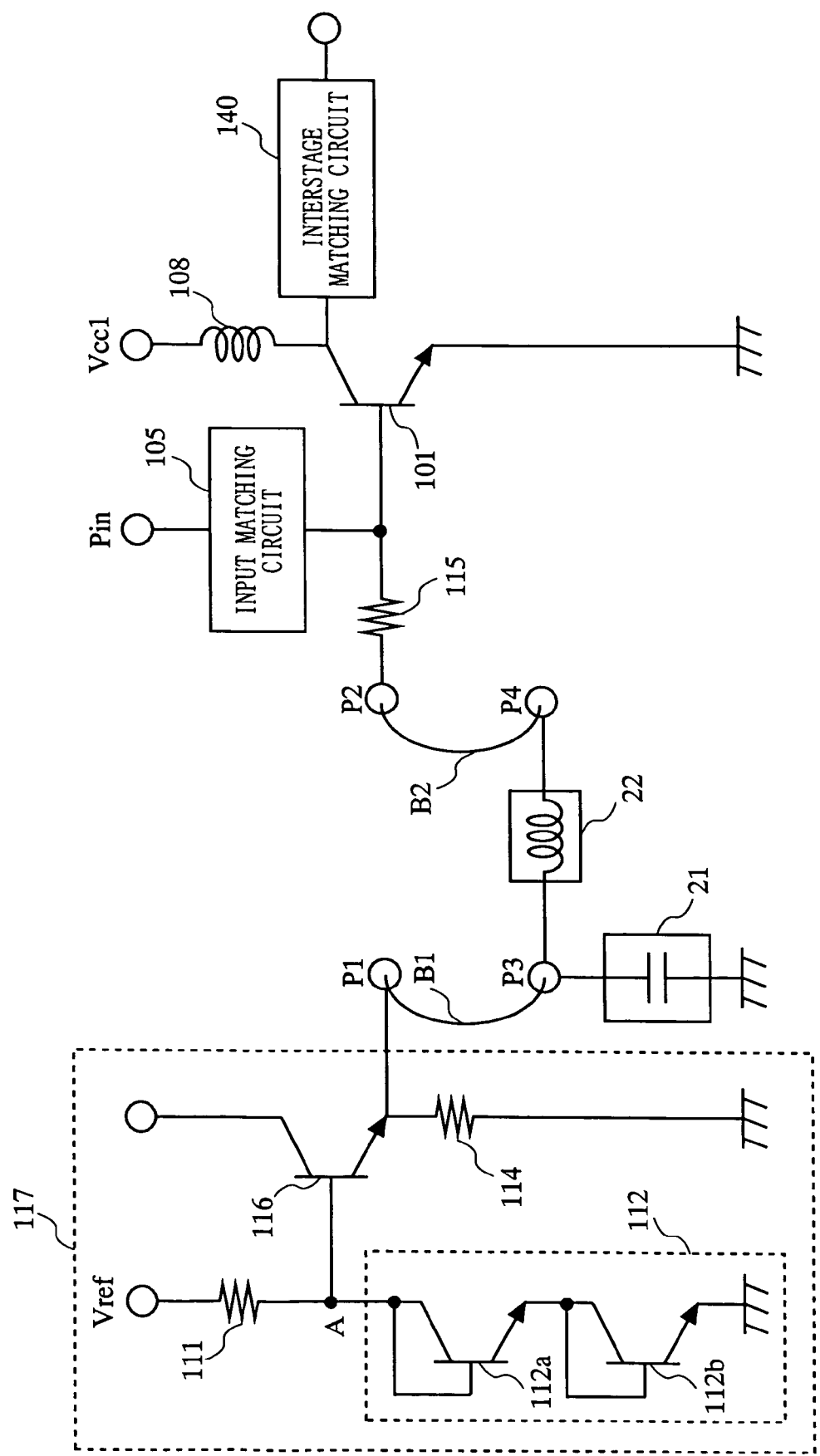
FIG. 3 is a circuit diagram of a high-frequency power amplifier according to a second embodiment of the present invention.

FIG. 3 is a circuit diagram of a high-frequency power amplifier according to a second embodiment of the present invention. The high-frequency power amplifier according to the present embodiment differs from the high-frequency power amplifier according to the first embodiment in that a direct current supply HBT 116 included in an upstream stage bias circuit 117 has a high frequency gain lower than that of the high-frequency signal amplification HBT 101. Other components are the same as those of the high-frequency power amplifier according to the first embodiment, and therefore the descriptions thereof are omitted herein.

In conventional high-frequency power amplifiers, the direct current supply HBT included in the upstream stage bias circuit 107 has the same characteristics as those of the high-frequency signal amplification HBT 101. Accordingly, unlike the high-frequency power amplifier according to the present embodiment, HBTs having different characteristics from each other are not used for the purpose of reducing the Rx noise.

As described above, it is conceivable that the Rx noise is generated because the difference frequency signal generated within the upstream stage bias circuit 107 and a transmission wave signal are mixed together. Accordingly, it is conceivable that the Rx noise can be reduced by reducing the level of the difference frequency signal. In the upstream stage bias circuit 107, power amplification is carried out by the direct current supply HBT. Therefore, the difference frequency signal generated within the upstream stage bias circuit 107 is also amplified by the direct current supply HBT.

Based on the above discussion, it can be said that if an HBT having a relatively low gain in the vicinity of the frequency of the difference frequency signal is used as the direct current supply HBT, it is possible to prevent power amplification of the difference frequency signal, thereby reducing the Rx noise generated within the high-frequency power amplifier. From this viewpoint, the high-frequency power amplifier according to the present embodiment is provided with the direct current supply HBT 116 having a high frequency gain lower than that of the high-frequency signal amplification HBT 101 in order to reduce power of the difference frequency signal and thereby to reduce the Rx noise generated within the high-frequency power amplifier.

An experiment was carried out with a PA module having a downstream stage amplification section connected to the high-frequency power amplifier according to the present embodiment. As a result, it was found out that the Rx noise level in a reception band from 884 MHz to 909 MHz is −140 dBm/Hz in the case where an HBT having a maximum oscillation frequency of 25 GHz is used as the high-frequency signal amplification HBT 101, an HBT having a maximum oscillation frequency of 3 GHz is used as the direct current supply HBT 116, the PA module is designed so as to have a gain of 28 dB in a transmission band from 824 MHz to 849 MHz. In the experiment using the high-frequency power amplifier according to the first embodiment, the Rx noise level was −137 dBm/Hz, therefore it was found that the high-frequency power amplifier according to the present embodiment further reduces the Rx noise level by 3 dBm/Hz.

As such, in the high-frequency power amplifier according to the present embodiment, where the direct current supply HBT 116 having a high frequency gain lower than that of the high-frequency signal amplification HBT 101 is provided in addition to the chip capacitor 21 and the chip inductor 22, the Rx noise level is further reduced.

Figure 4:
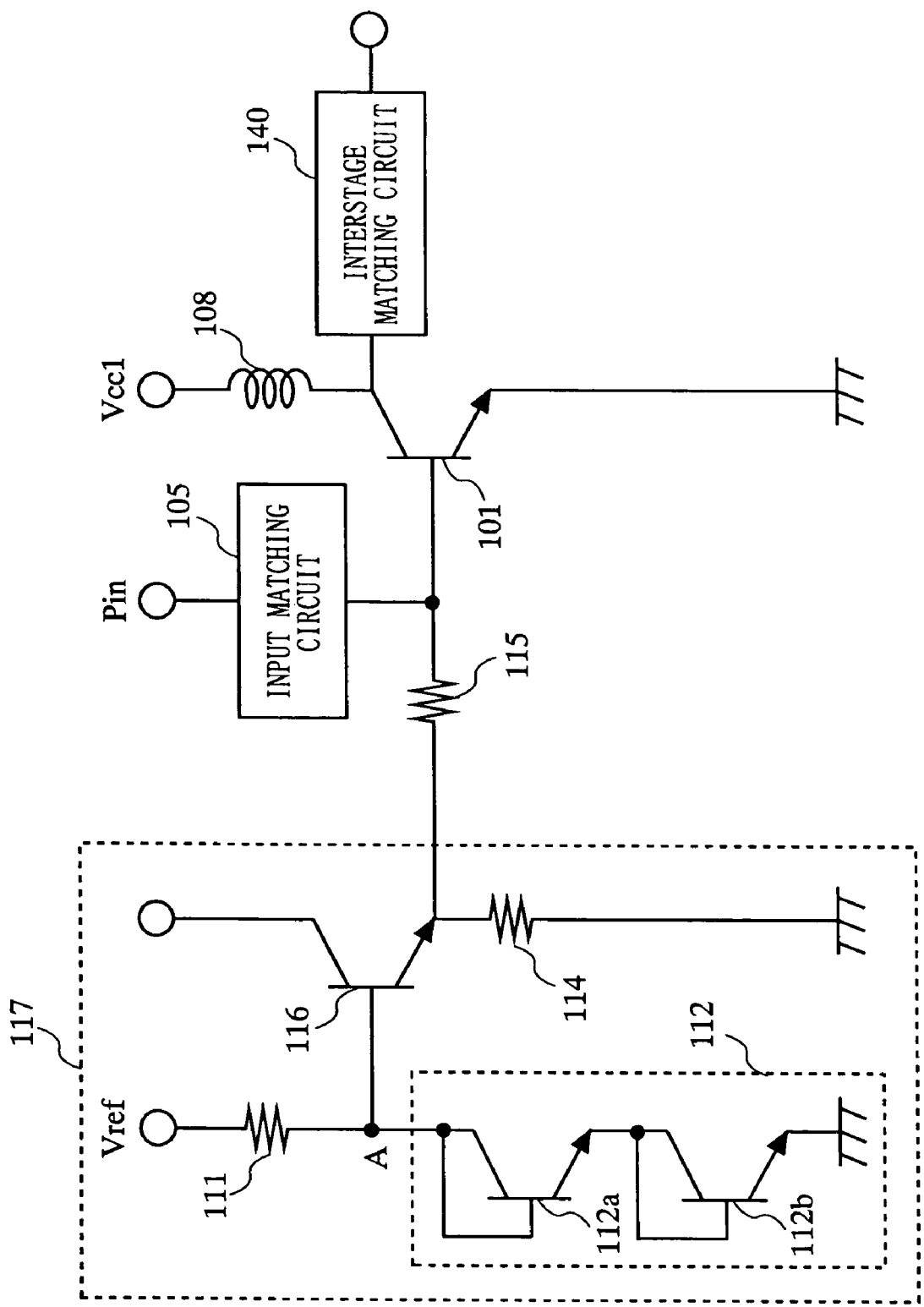
FIG. 4 is a circuit diagram showing another exemplary high-frequency power amplifier according to the second embodiment of the present invention.

Note that in the conventional high-frequency power amplifiers, if the HBT having a high frequency gain lower than that of the high-frequency signal amplification HBT 101 is used as the direct current supply HBT, it is possible to reduce the Rx noise level. FIG. 4 shows a circuit diagram of such a high-frequency power amplifier.

Figure 5:
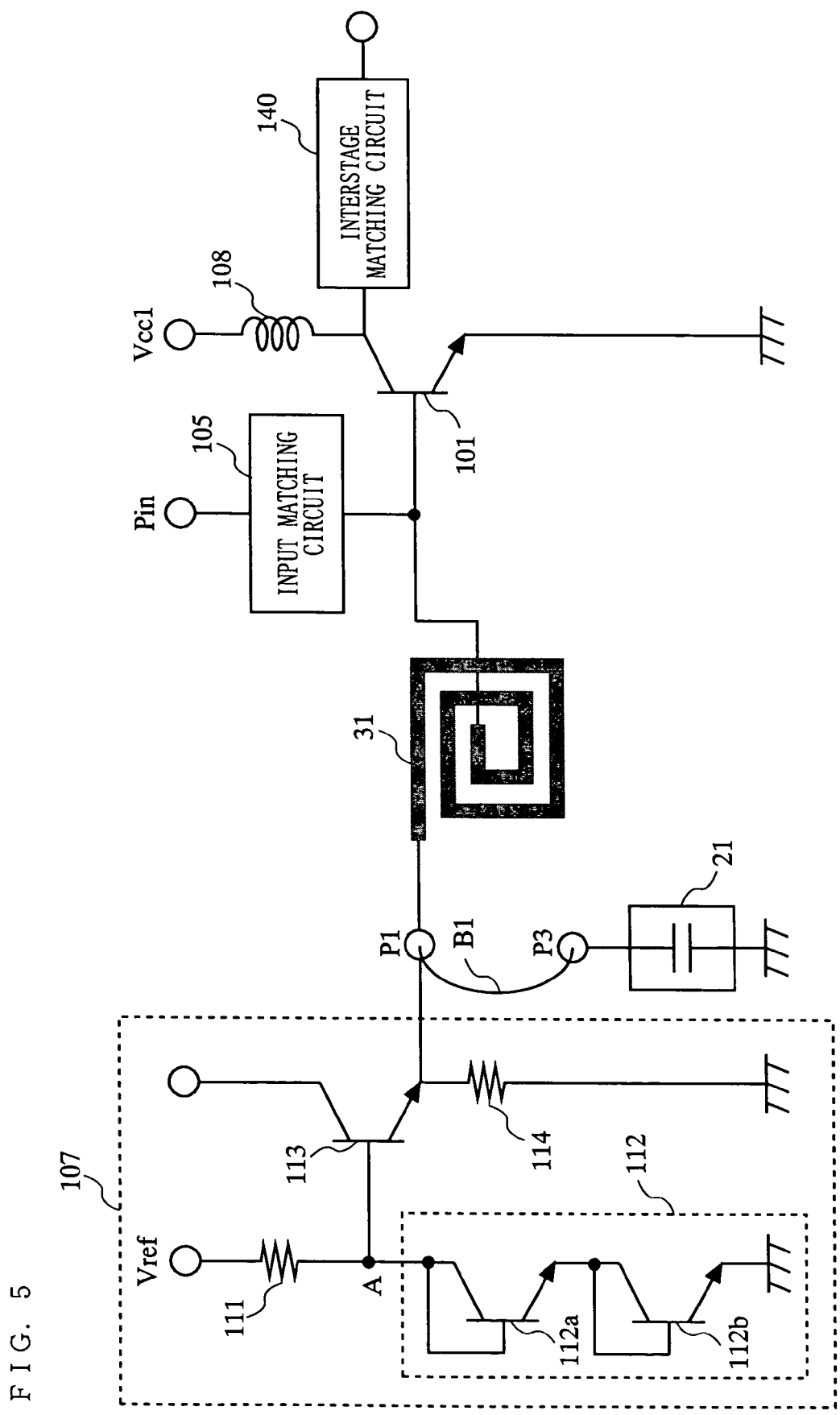
FIG. 5 is a circuit diagram of a high-frequency power amplifier according to a third embodiment of the present invention.

FIG. 5 is a circuit diagram showing a structure of a high-frequency power amplifier according to a third embodiment of the present invention. The high-frequency power amplifier according to the present embodiment differs from the high-frequency power amplifier according to the first embodiment shown in FIG. 1 in the following two points: the high-frequency power amplifier according to the present embodiment uses a spiral inductor 31; and the high-frequency power amplifier according to the present embodiment does not include the resistor 115.

In the case where the spiral inductor 31 is formed on the module substrate 134 shown in FIG. 2, there are advantages as described below as compared to a case where a chip inductor is used. Firstly, in the case where the chip device is used, it is necessary to form the pads P1 and P2 on a single GaAs chip, while forming the pads P3 and P4 on the ceramic substrate. The pads required for the bonding wires B1 and B2 increase an overall pad area, making it difficult to produce a compact high-frequency power amplifier. On the other hand, in the high-frequency power amplifier according to the present embodiment, only the pads P1 and P3 are required for the bonding wire B1, and therefore the above problem is considerably lessened.

Also, in the case where the chip inductor is used, it is necessary to connect the pads P2 and P4 together, and to provide a high-frequency-related circuit external to the GaAs chip. Accordingly, it is not possible to form a matching circuit within the limits of a single semiconductor chip, and therefore it is necessary to prepare a circuit design in which a portion from the pad P2 to the inductor is included in the input matching circuit 105, resulting in a complicated high-frequency circuit design. Also, the input matching circuit 105 is partially formed on the ceramic substrate, and therefore it is difficult to isolate the input matching circuit 105 from a λ/4 impedance transformer for the high-frequency signal amplification HBT 101 in the high-frequency range, resulting in frequent occurrence of abnormal oscillation due to feedback of the high-frequency signal. On the other hand, in the high-frequency power amplifier according to the present embodiment, an input matching circuit section is formed within the limits of a single GaAs chip, and therefore easy design of a high-frequency circuit is facilitated as compared to the case where the chip inductor is used, there by solving the above problems.

Described next is the spiral inductor 31. The area of the spiral inductor 31 is defined by a line width, spacing between lines, and the number of turns. For the spiral inductor 31, the line width, the spacing between lines, and the number of turns are determined in accordance with a required inductance, a required resistance value, etc.

The spiral inductor 31 was actually produced so as to have an inductance of 10 nH, and a resistance of 20Ω. In the case where GaAs was used as a material, and the line width, the spacing between lines, and the number of turns were set so as to be 4 µm, 4 µm, and 8 turns, respectively, the area of the spiral inductor 31 was merely 110 µm×110 µm. Accordingly, it was found that if the spiral inductor 31 is used, it is possible to produce a more compact inductor as compared to the case where the chip inductor is used.

Also, in the high-frequency power amplifier according to the present embodiment, even if a relatively small resistor of about 5Ω is required between the direct current supply HBT 113 and the high-frequency signal amplification HBT 101, the area of the spiral inductor 31 can be restricted to about 150 µm×150 µm. Thus, it is possible to restrict the high-frequency power amplifier to such a size as to be adequate for practical applications.

In the high-frequency power amplifier according to the present embodiment, the spiral inductor 31 is formed on the semiconductor substrate. This facilitates easy design of a high-frequency circuit, and realizes a compact high-frequency power amplifier.

Note that in the PA module shown in FIG. 2, instead of using the chip capacitor, a capacitor may be formed using a laminated structure of the module substrate 134. This further reduces the size of the high-frequency power amplifier.

Also, a capacitor having a capacitance value of about 100 pF can be produced by using interlayer films made of a strontium titanium oxide (STO: permittivity ∈r=100) which is a high-k dielectric material. In this case, the capacitor can be produced so as to have a film thickness of about 2000 Å and an area of about 150 µm×150 µm, and therefore it is possible to integrate capacitors on a single GaAs chip.

Figure 6:
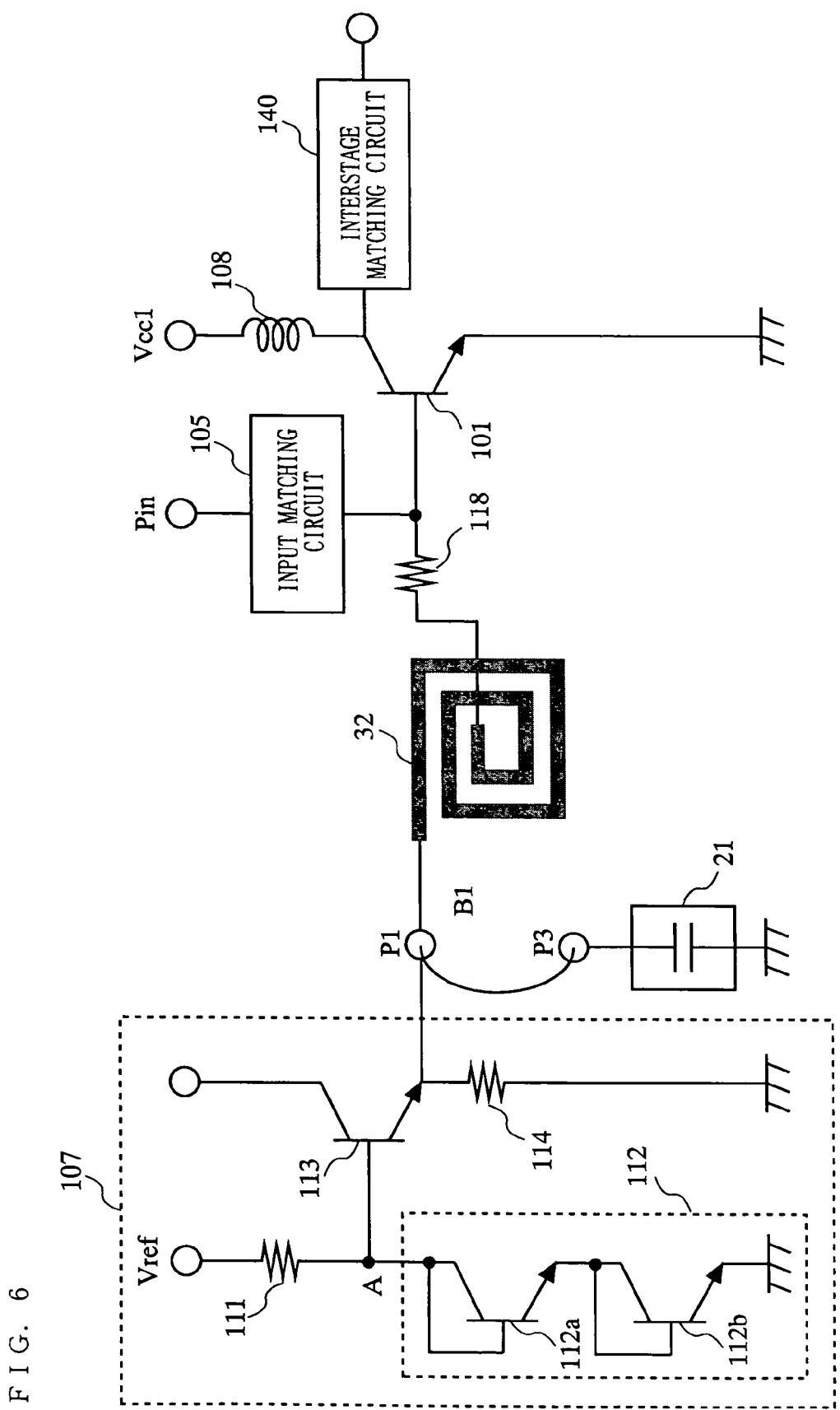
FIG. 6 is a circuit diagram of a high-frequency power amplifier according to a fourth embodiment of the present invention.

FIG. 6 is a circuit diagram of a high-frequency power amplifier according to a fourth embodiment of the present invention. The high-frequency power amplifier according to the fourth embodiment differs from the high-frequency power amplifier according to the third embodiment in that the high-frequency power amplifier according to the present embodiment includes a resistor 118 between the spiral inductor 32 and the high-frequency signal amplification HBT 101.

In some cases of designing circuits of the high-frequency power amplifier, there might be a difficulty in accurately providing necessary resistance between the direct current supply HBT 113 and the high-frequency signal amplification HBT 101 using only the spiral inductor 32. However, in the high-frequency power amplifier according to the present embodiment, a resistance value of the resistor 118 is adjusted when designing circuits, such that necessary resistance can be accurately provided between the direct current supply HBT 113 and the high-frequency signal amplification HBT 101 without changing the inductance value of the spiral inductor 32.

For example, in the high-frequency power amplifier according to the present embodiment, if a resistance value required between the direct current supply HBT 113 and the high-frequency signal amplification HBT 101 is 20Ω, and resistance provided by the spiral inductor 32 is about 80% of the required resistor value (about 16Ω), it is possible to easily compensate for a 20% shortage (about 4Ω) using the resistor 118.

Figure 7:
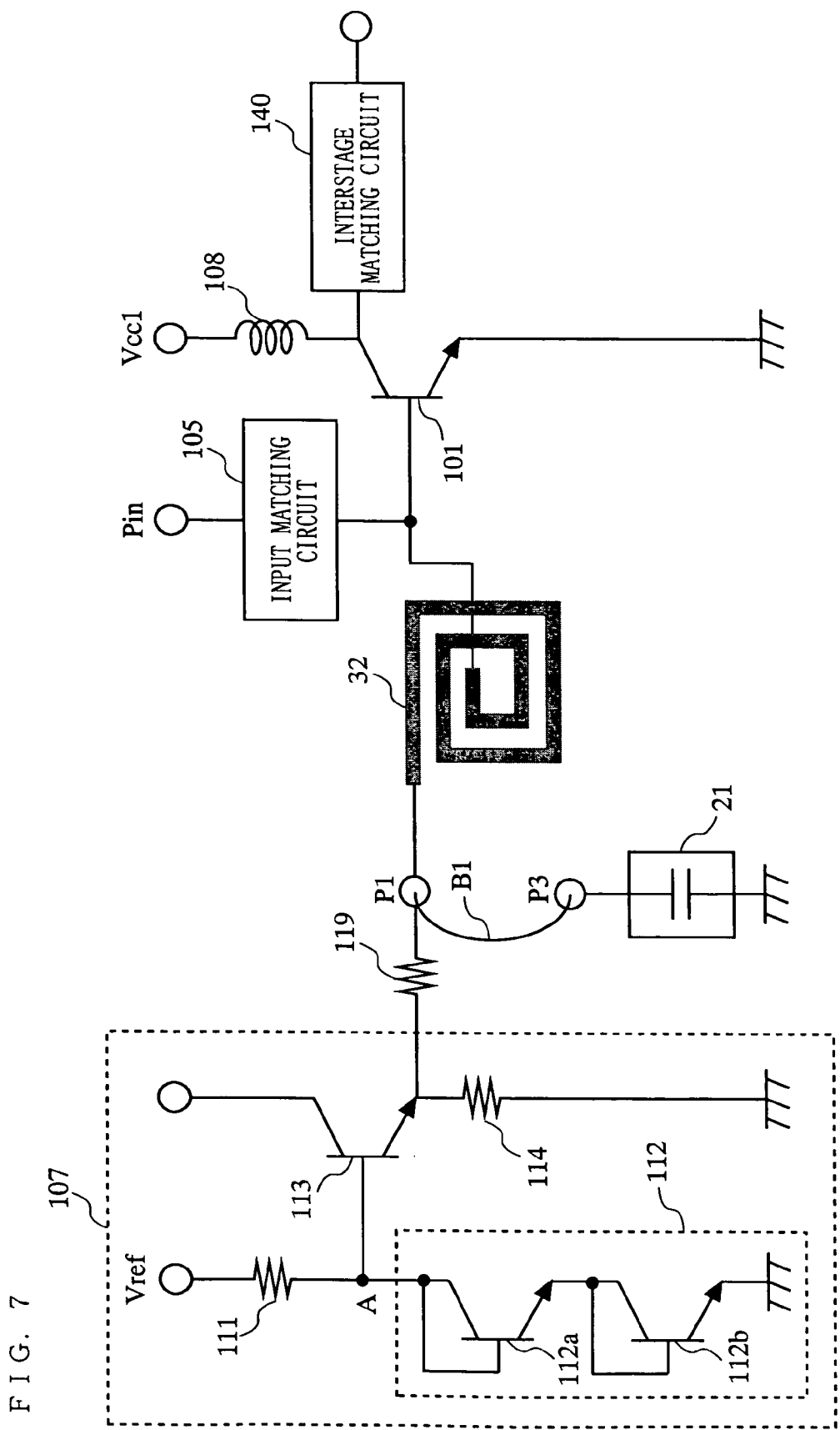
FIG. 7 is a circuit diagram of a high-frequency power amplifier according to a fifth embodiment of the present invention.

FIG. 7 is a circuit diagram of a high-frequency power amplifier according to a fifth embodiment of the present invention. The high-frequency power amplifier according to the fifth embodiment differs from the high-frequency power amplifier according to the third embodiment in that a resistor 119 is connected between the emitter electrode of the direct current supply HBT 113 and the pad P1.

As described in relation to the fourth embodiment of the present invention, the spiral inductor 32 and a resistor are used to accurately provide necessary resistance between the direct current supply HBT 113 and the high-frequency signal amplification HBT 101. However, depending on the type of the resistor, noise might by generated by the resistor, so that the noise increases the Rx noise level.

In order to solve such a problem, the high-frequency power amplifier according to the present embodiment includes the resistor 119 between the emitter electrode of the direct current supply HBT 113 and the pad P1, such that the chip capacitor 21 causes noise generated at the resistor 119 to flow to the ground. This reduces the noise generated at the resistor 119, thereby reducing the Rx noise level.

An experiment was carried out with a PA module with a downstream stage amplification section connected to the high-frequency power amplifier according to the present embodiment. Also, for comparison purposes, an experiment was carried out with respect to the high-frequency power amplifier according to the fourth embodiment under the same conditions. Under the experimental conditions, the resistance value of the spiral inductor 32 was set so as to be 16Ω, and resistance values of the resistors 118 and 119 were set so as to be 14Ω. As a result, the Rx level of the high-frequency power amplifier according to the present embodiment was reduced by 2 dBm/Hz from the Rx level of the high-frequency power amplifier according to the fourth embodiment. Although the high-frequency power amplifier according to the present embodiment and the high-frequency power amplifier according to the fourth embodiment differ from each other only in the positions of the resistors, they were equivalent to each other with respect to the value of combined resistance of the spiral inductor and the resistor. Accordingly, it was found that their high frequency characteristics, including temperature characteristics, are substantially the same as each other.

As described above, in the high-frequency power amplifier according to the present embodiment, the chip capacitor 21 reduces noise generated at the resistor 119. Thus, it is possible to further reduce the Rx noise without changing the high frequency characteristics of the high-frequency power amplifier.

Figure 8:
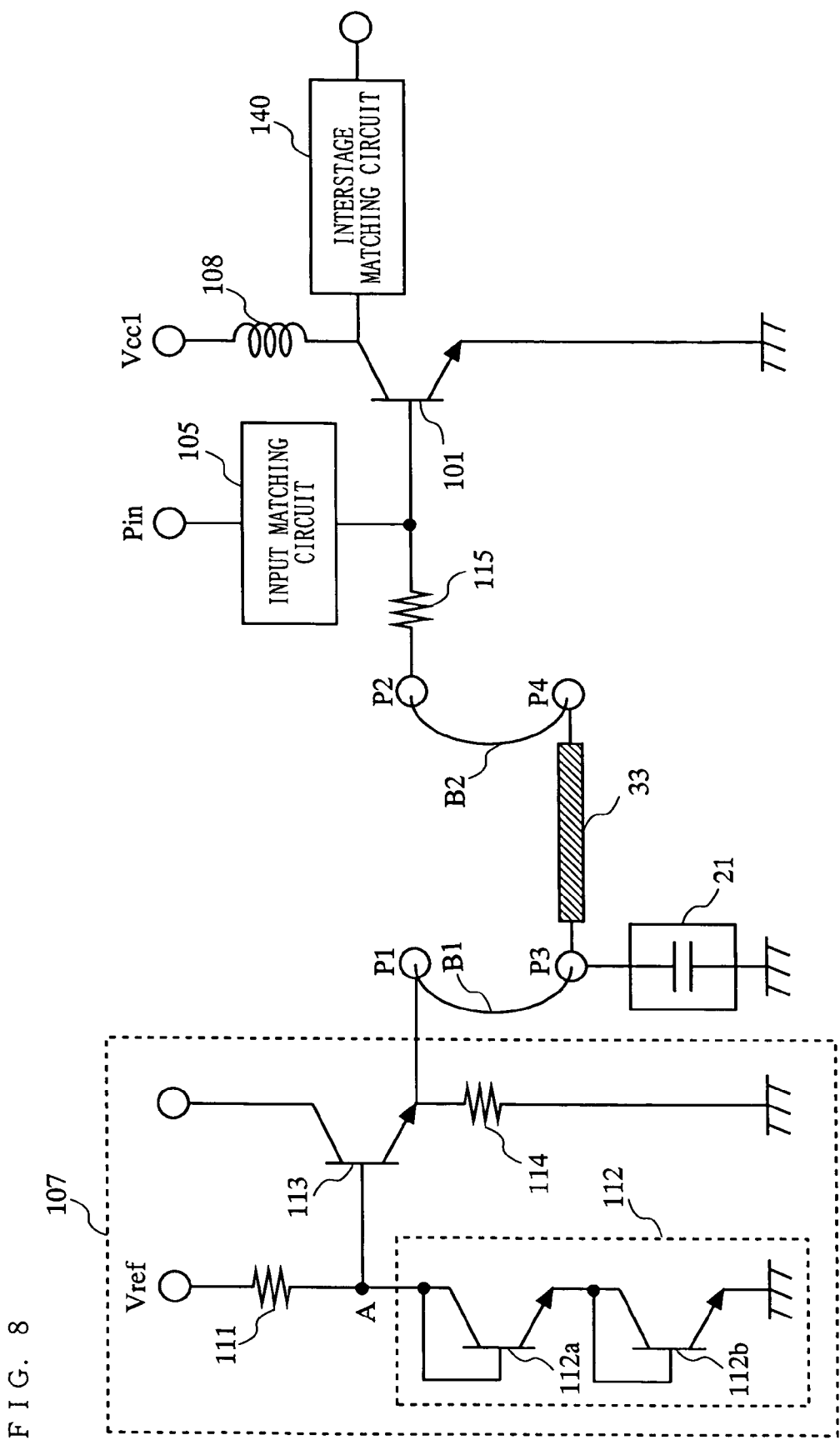
FIG. 8 is a circuit diagram of a high-frequency power amplifier according to a sixth embodiment of the present invention.

FIG. 8 is a circuit diagram of a high-frequency power amplifier according to a sixth embodiment of the present invention. The high-frequency power amplifier according to the sixth embodiment differs from the high-frequency power amplifier according to the first embodiment in that the high-frequency power amplifier according to the sixth embodiment includes a conductive line 33 in place of the chip inductor 22 shown in FIG. 1. The conductive line 33 is formed by the metal conductor 122 shown in FIG. 2.

In the high-frequency power amplifier according to the present embodiment, impedance due to phase rotation of the conductive line 33 at a transmission frequency is equal to impedance of the chip inductor 22 of the high-frequency power amplifier according to the first embodiment, and therefore it is possible to achieve an effect similar to that of the high-frequency power amplifier according to the first embodiment.

Also, the high-frequency power amplifier according to the present embodiment includes the conductive line 33 instead of including the chip inductor 22 or the spiral inductor 31, whereby it is possible to achieve a reduction in cost of the high-frequency power amplifier.

Note that the conductive line 33 may be either a microstrip line formed on a surface of the module substrate 134 shown in FIG. 2 or a strip line formed between ceramic layers.

Also, in the case where the conductive line 33 has, as distributed constants, necessary resistance and inductance between the direct current supply HBT 113 and the high-frequency signal amplification HBT 101, the resistor 115 may not be provided.

While the invention has been described in detail, the foregoing description is in all aspects illustrative and not restrictive. It is understood that numerous other modifications and variations can be devised without departing from the scope of the invention.

What is claimed is:

1. A high-frequency power amplifier for amplifying a high-frequency signal, comprising:
   a high-frequency signal amplification transistor for amplifying the high-frequency signal;
   a bias circuit for supplying current to a base electrode of the high-frequency signal amplification transistor;
   an inductor connected between the high-frequency signal amplification transistor and the bias circuit; and
   a capacitor connected at one end between the bias circuit and the inductor and grounded at another end,
   wherein the bias circuit includes:
   a current supply transistor for supplying current to the high-frequency signal amplification transistor; and
   a temperature compensation circuit for temperature-compensating the high-frequency signal amplification transistor,
   the high-frequency power amplifier further comprising a resistor connected between the high-frequency signal amplification transistor and the inductor.

2. A high-frequency power amplifier for amplifying a high-frequency signal, comprising:
   a high-frequency signal amplification transistor for amplifying the high-frequency signal;

a bias circuit for supplying current to a base electrode of the high-frequency signal amplification transistor;

an inductor connected between the high-frequency signal amplification transistor and the bias circuit; and a capacitor connected at one end between the bias circuit and the inductor and grounded at another end, wherein the bias circuit includes:

a current supply transistor for supplying current to the high-frequency signal amplification transistor; and a temperature compensation circuit for temperature-compensating the high-frequency signal amplification transistor, wherein the high-frequency signal amplification transistor and the bias circuit are formed on a semiconductor substrate, the high-frequency power amplifier further comprising a resistor connected between the high-frequency signal amplification transistor and the inductor.

3. A high-frequency power amplifier according to claim 2, wherein the inductor and the capacitor each are composed of a chip device.

4. A high-frequency power amplifier according to claim 3, wherein the current supply transistor has a characteristic different from that of the high-frequency signal amplification transistor.

5. A high-frequency power amplifier according to claim 3, wherein the current supply transistor has a high frequency gain lower than that of the high-frequency signal amplification transistor.

6. A high-frequency power amplifier for amplifying a high-frequency signal, comprising:

a high-frequency signal amplification transistor for amplifying the high-frequency signal;

a bias circuit for supplying current to a base electrode of the high-frequency signal amplification transistor;

an inductor connected between the high-frequency signal amplification transistor and the bias circuit; and a capacitor connected at one end between the bias circuit and the inductor and grounded at another end, wherein the bias circuit includes:

a current supply transistor for supplying current to the high-frequency signal amplification transistor; and a temperature compensation circuit for temperature-compensating the high-frequency signal amplification transistor, wherein the high-frequency signal amplification transistor and the bias circuit are formed on a semiconductor substrate, and the inductor is a spiral inductor formed on the semiconductor substrate, the high-frequency power amplifier further comprising a resistor connected between the high-frequency signal amplification transistor and the spiral inductor.

7. A high-frequency power amplifier for amplifying a high-frequency signal, comprising:

a first transistor for amplifying the high-frequency signal; and a bias circuit for supplying bias current to a base electrode of the first transistor, wherein the bias circuit includes:

a second transistor having a characteristic different from that of the first transistor; and a temperature compensation circuit for temperature-compensating the first transistor, wherein the second transistor has a high frequency gain lower than that of the first transistor.

* * * * *